United States Patent
Reohr, Jr. et al.

(10) Patent No.: US 6,298,006 B1
(45) Date of Patent: Oct. 2, 2001

(54) METHOD AND APPARATUS TO AUTOMATICALLY DETERMINE THE SIZE OF AN EXTERNAL EEPROM

(75) Inventors: Richard D. Reohr, Jr., Hillsboro; Brian M. Collins, Aloha, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,302

(22) Filed: Dec. 30, 1999

(51) Int. Cl.[7] ..................................... G11C 8/00
(52) U.S. Cl. ............... 365/236; 365/185.05; 365/185.35
(58) Field of Search ............................... 365/185.05, 236, 365/185.33; 711/170, 171, 172

(56) References Cited

U.S. PATENT DOCUMENTS

| | | | |
|---|---|---|---|
| 4,468,729 | * 8/1984 | Schwartz | 711/172 |
| 4,926,314 | * 5/1990 | Dhuey | 711/172 |
| 5,003,506 | * 3/1991 | Itaya | 711/172 |
| 5,175,836 | * 12/1992 | Morgan | 711/172 |
| 6,003,121 | * 12/1999 | Wirt | 711/170 |

* cited by examiner

Primary Examiner—David Nelms
Assistant Examiner—Gene N. Auduone
(74) Attorney, Agent, or Firm—Fish & Richardson PC

(57) ABSTRACT

The present invention automatically determines the size of an EEPROM in a circuit. A controller is connected to the EEPROM with both a "data to" the EEPROM connection and a "data from" the EEPROM connection. The controller begins to send logical low address bits over the "data to" the EEPROM connection. After each address bit is transmitted, the controller increments the value of a counter. The controller continually monitors the data from the EEPROM connection to determine when the EEPROM has been successfully addressed. Once the EEPROM receives the appropriate number of address bits to fully address the first address location, the EEPROM drives the "data from" connection low. The controller then uses the value of the counter to determine the size of the EEPROM. The controller may either calculate the size of the EEPROM or use the value of the counter in a look-up table.

20 Claims, 3 Drawing Sheets

| Counter Value | EEPROM Size |
|---|---|
| 0-3 | ---- |
| 4 | 256 bits |
| 5 | 512 bits |
| 6 | 1 Kbits |
| 7 | 2 Kbits |
| 8 | 4 Kbits |
| 9 | 8 Kbits |
| 10 | 16 Kbits |
| 11 | 32 Kbits |
| 12 | 64 Kbits |

METHOD AND APPARATUS TO AUTOMATICALLY DETERMINE THE SIZE OF AN EXTERNAL EEPROM

BACKGROUND OF THE INVENTION

Non-volatile semiconductor or solid-state memories have the advantage of being fast, light-weight and low-power. Examples are ROM (read only memory), PROM (programmable read only memory), and EEPROM (electrically erasable programmable read only memory), which retain their memory even after power is shut down. However, ROM and PROM cannot be reprogrammed. EEPROM's have the advantage of being electrically writable (or programmable) and erasable. EEPROMs are used in electronic devices for storage of essential information which has to be maintained during power off and/or which has to be available when the electronic system is initialized. These semiconductor memories have been employed in small amounts for permanent storage of certain computer system codes or system parameters that do not change.

One common application of the use of an EEPROM is in network interface cards, such as those of the Next Generation Input/Output (NGIO) network interface card. In the interface cards, a controller needs access to non-volatile information which is established at the time of the board manufacturing. Examples of this non-volatile information includes a globally unique identification (GUID), the size of an external FLASH (if any), the subsystem vendor, the device identifications, and the configuration of the ports. The EEPROM can be programmed to store this information.

Board manufactures can generally choose what size EEPROM to include for each application. However, to access the information on the EEPROM, the controller on the board needs information on the size of the EEPROM. The size of the EEPROM has previously been communicated with the use of software or dedicated strapping pins. Each of these solutions increased the complexity of the boards and the cost of manufacturing, and did not allow the board designer to easily adjust the size of the EEPROM.

A system to provide flexibility in part selection for an interface card is desirable. This would allow various sizes of EEPROMS to be used with a controller, allowing the designer to minimize the number of interfaces supported. Additionally, if the size of the EEPROM was easily determined, the designer could select the least expensive EEPROM available.

SUMMARY OF THE INVENTION

The present invention automatically determines the size of an EEPROM in a circuit. A controller is connected to the EEPROM with both a "data to" the EEPROM connection and a "data from" the EEPROM connection. The controller begins to send logical low address bits over the "data to" the EEPROM connection. After each address bit is transmitted, the controller increments the value of a counter. The controller continually monitors the data from the EEPROM connection to determine when the EEPROM has been successfully addressed. Once the EEPROM receives the appropriate number of address bits to fully address the first address location, the EEPROM drives the "data from" connection low. The controller then uses the value of the counter to determine the size of the EEPROM. The controller may either calculate the size of the EEPROM or use the value of the counter in a look-up table.

One aspect of the present invention defines a method of determining a size of an EEPROM that includes providing an address bit to the EEPROM, incrementing a value of a counter, repeating the providing and the incrementing until the EEPROM responds, and determining the size of the EEPROM from the value of the counter.

BRIEF DESCRIPTION OF THE DRAWINGS

These and other features and advantages of the invention will become more apparent upon reading the following detailed description and upon reference to the accompanying drawings.

DESCRIPTION OF THE PREFERRED EMBODIMENTS

Figures 1, 4:
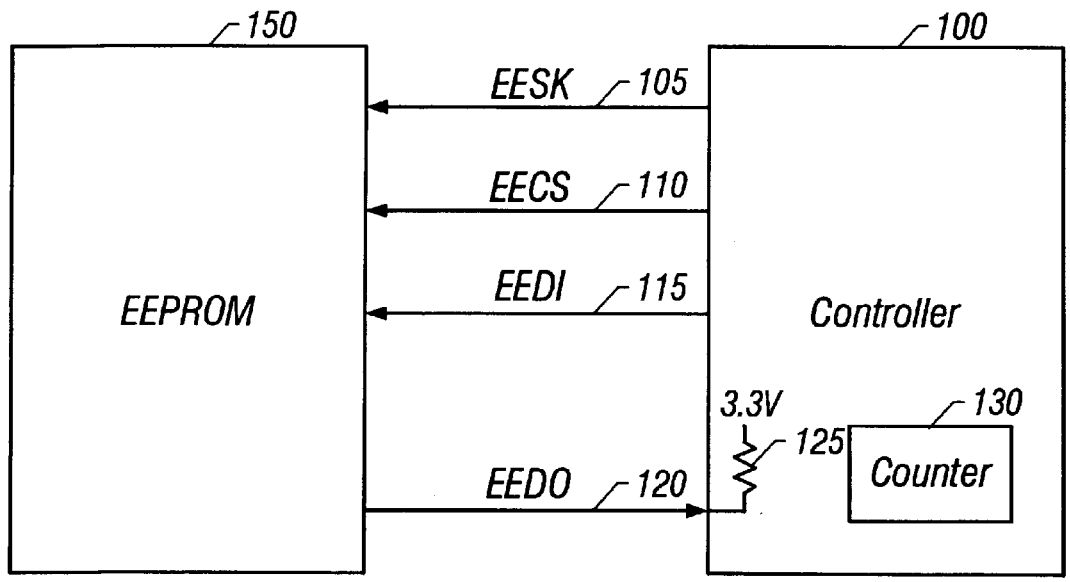
FIG. 1 is a block diagram of a controller and EEPROM connected according to one embodiment of the present invention.
FIG. 4 is an example of a look-up table to be used to determine the size of an EEPROM according to the present invention.

FIG. 1 is a block diagram of a controller 100 and an EEPROM 150 connected according to one embodiment of the present invention. The controller 100 provides a plurality of signals to the EEPROM 150, including a clock signal (EESK) 105, a chip select signal (EECS) 110, and a data-in signal (EEDI) 115. The EEPROM 150 also provides a data-out signal (EEDO) 120 to the controller 100. The controller 100 also includes a counter 130.

The chip select signal 110 is typically a logical low. However, when the controller 100 needs to communicate with the EEPROM 150, the controller changes the chip select signal 110 to a logical high. This activates the EEPROM 150 to begin to receive communications from the controller 100.

The clock signal 105 provides a clock between the controller 100 and the EEPROM 150 to synchronize communications. Once the EEPROM 150 is activated, the controller 100 sends address information over the data-in signal 115. The address information specifies the address location in the EEPROM 150 of the desired information. The EEPROM 150 expects the address to be provided with the most significant bit first. Subsequent address bits are provided serially until the least significant address bit has been transferred over the data-in line 115. While the EEPROM 150 is receiving the address data, the EEPROM floats the data-out line 120. After the last address bit is received, the EEPROM 150 actively drives the data-out line 120 low, indicating to the controller 100 to prepare to receive data. The EEPROM 150 then provides data to the controller 100 over the data-out line 120. This process is repeated until the controller 100 receives all the necessary data.

The controller 100 includes a pull-up resistor 125 connected to the data-out line 120. The pull-up resistor 125 passively drives the data-out line 120 to a logical high. The pull-up resistor 125 is connected to a control voltage to enable the data-out line 120 to be passively driven high. The control voltage may be, for example, approximately 3.3 volts. Of course, other control voltages may be used. When the EEPROM 150 overrides the pull-up resistor 125 when the data-out line 120 is actively driven low.

Figure 2:
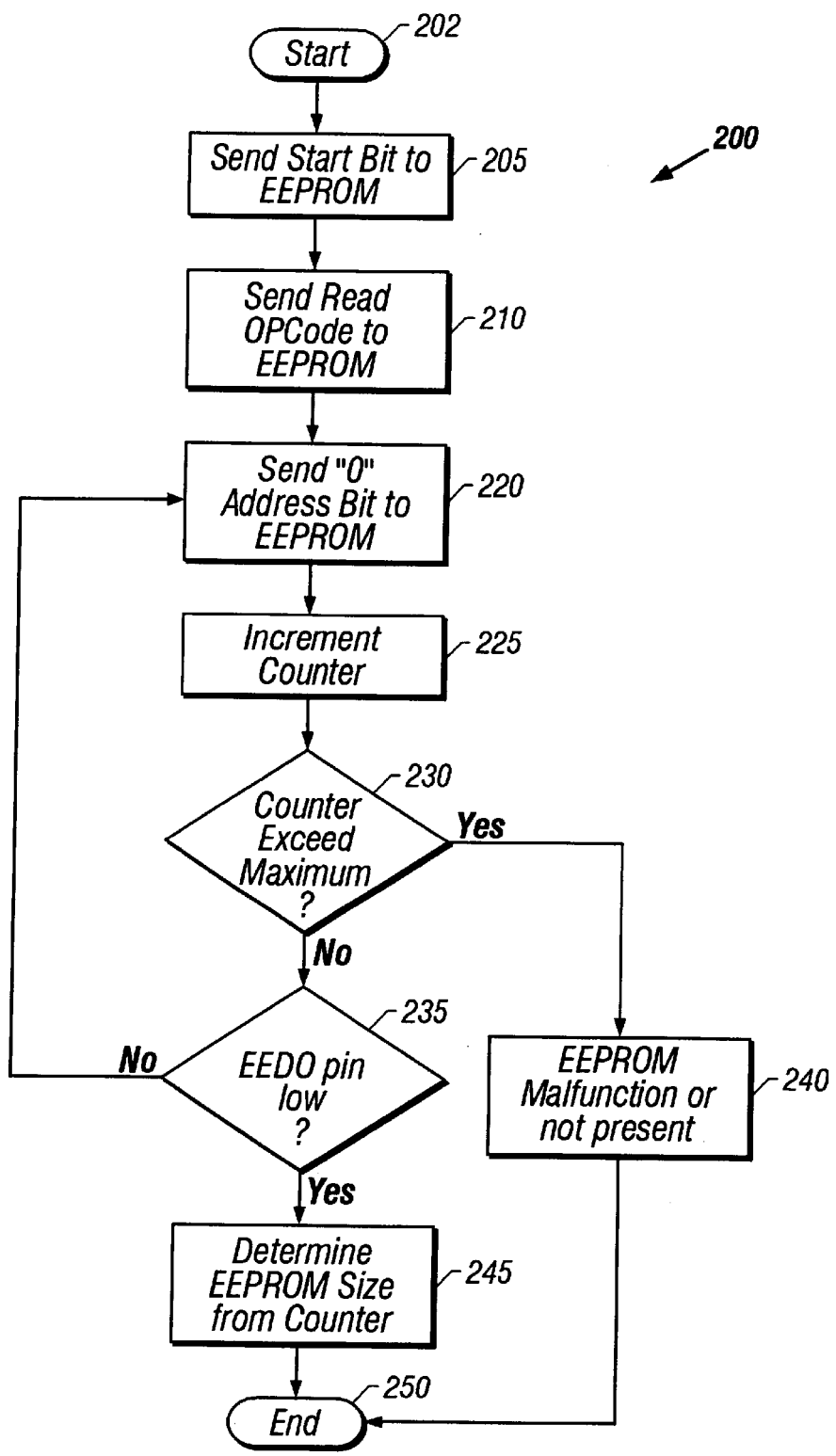
FIG. 2 illustrates the process of determining the size of an EEPROM according to the present invention.

FIG. 2 illustrates the process 200 used by the present invention to automatically determine the size of the EEPROM 150. The process 200 begins at start state 202. Proceeding to state 205, the controller 100 sends a start bit to the EEPROM 150. The start bit is transmitted along the data-in line 115. Proceeding to state 210, the controller 100 sends a Read OpCode to the EEPROM 150, also along the data-in line 115. The Read OpCode contains 2 bits. The start bit and the Read OpCode indicate to the EEPROM 150 that the controller 100 is about to address the EEPROM 150.

Proceeding to state 220, the controller 100 begins addressing the EEPROM 150 by sending a logical low, or "0" address bit along the data-in line 115. The controller 100 reads from address location zero first, so the initial address data is a series of logical low, or "0" bits. The EEPROM 150 expects the address to be provided with the most significant address bit first and subsequent address bits to be provided serially until the least significant address bit has been transferred.

Proceeding to state 225, after transferring the address bit, the controller 100 increments the counter 130. The counter 130 maintains a constant count of how many address bits have been transferred to the EEPROM 150. The counter 130 may be part of the controller 100 or may be separate from the controller 100.

Proceeding to state 230, the process 200 determines if the counter 130 has exceeded a maximum value. If the EEPROM 150 is either malfunctioning or not present, then the controller 100 cannot communicate with the EEPROM 150. Therefore, the controller 100 may be programmed with the maximum allowable size of an EEPROM 150. For example, if the maximum allowable size of an EEPROM 150 is 64 Kbits, the maximum value for the counter would be 16. If the controller 100 sent over 16 address bits without the EEPROM 150 responding, the EEPROM would either be malfunctioning or not present. Therefore, if the counter 130 exceeds the maximum, the process 200 proceeds along the YES branch to state 240. In state 240, the controller 100 determines that the EEPROM 150 is either malfunctioning or not present. The process 200 then proceeds to end state 250.

Returning to state 230, if the counter 130 has not exceeded the maximum, the process 200 proceeds along the NO branch to state 235. In state 235, the process 200 determines if the data-out line 120 from the EEPROM 150 is at a logical low. As stated above, the pull-up resistor 125 passively drives the data-out line 120 to a logical high. In order for the data-out line 120 to be at a logical low, the EEPROM 150 must override the pull-up resistor 125 and actively drive the data-out line 120 low. The EEPROM 150 drives the data-out line 120 low when the EEPROM 150 receives the last bit of an address. By driving the data-out line 120 low, the EEPROM 150 communicates to the controller 100 that the EEPROM 150 is ready to receive data.

If the data-out line 120 is not at a logical low, the process 200 proceeds along the NO branch back to state 220 where an additional logical low bit, or "0" is transmitted to the EEPROM 150. Because the initial address location to be addressed in the EEPROM 150 is location zero, the process 200 can supply a serial string of logical low bits until the EEPROM is properly addressed, or the maximum permissible size of an EEPROM 150 has been reached. For example, in a 256 bit EEPROM, address location zero would have a binary address of 0000 where address location zero of an 8 Kbit EEPROM would be 000000000. The process 200 would then again increment the counter 130 in state 225, check if the counter exceeded the maximum predetermined value in state 230, and if not, check if the data-out line 120 was at a logical low in state 235. The process 200 remains in this loop sending additional logical low address bits and incrementing the counter 130 until the data-out line 120 is at a logical low or the maximum value of the counter 130 is reached.

Returning to state 235, if the data-out line 120 is at a logical low, the process 200 proceeds along the YES branch to state 245 where the size of the EEPROM 150 is determined from the value of the counter 130. The value of counter 130 equals the number of address bits transmitted to the EEPROM 150 until the EEPROM 150 responded. Therefore, the controller 100 can determine from either a look-up table or by calculations the size of the EEPROM 150. An example of a look-up table 400 is seen in FIG. 4. The look-up table 400 shows an example where the size of the EEPROM 150 is between 256 bits and 64 Kbits. In this situation, the counter 130 would not have a value of 0–3 bits, as this would not be enough to address the minimum 256 bit EEPROM 150. A counter value of 4 indicates a 256 bit EEPROM 150. A counter value of 5 indicates a 512 bit EEPROM 150. A counter value of 6 indicates a 1 Kbit EEPROM 150. A counter value of 7 indicates a 2 Kbit EEPROM 150. A counter value of 8 indicates a 4 Kbit EEPROM 150. A counter value of 9 indicates a 8 Kbit EEPROM 150. A counter value of 10 indicates a 16 Kbit EEPROM 150. A counter value of 11 indicates a 32 Kbit EEPROM 150. A counter value of 12 indicates a 64 Kbit EEPROM 150. Any counter value above 12 would cause the process 200 to indicate a malfunctioning or non-present EEPROM 150 in state 240. After the EEPROM 150 size is determined, the process 200 terminates in end state 250.

Figure 3:
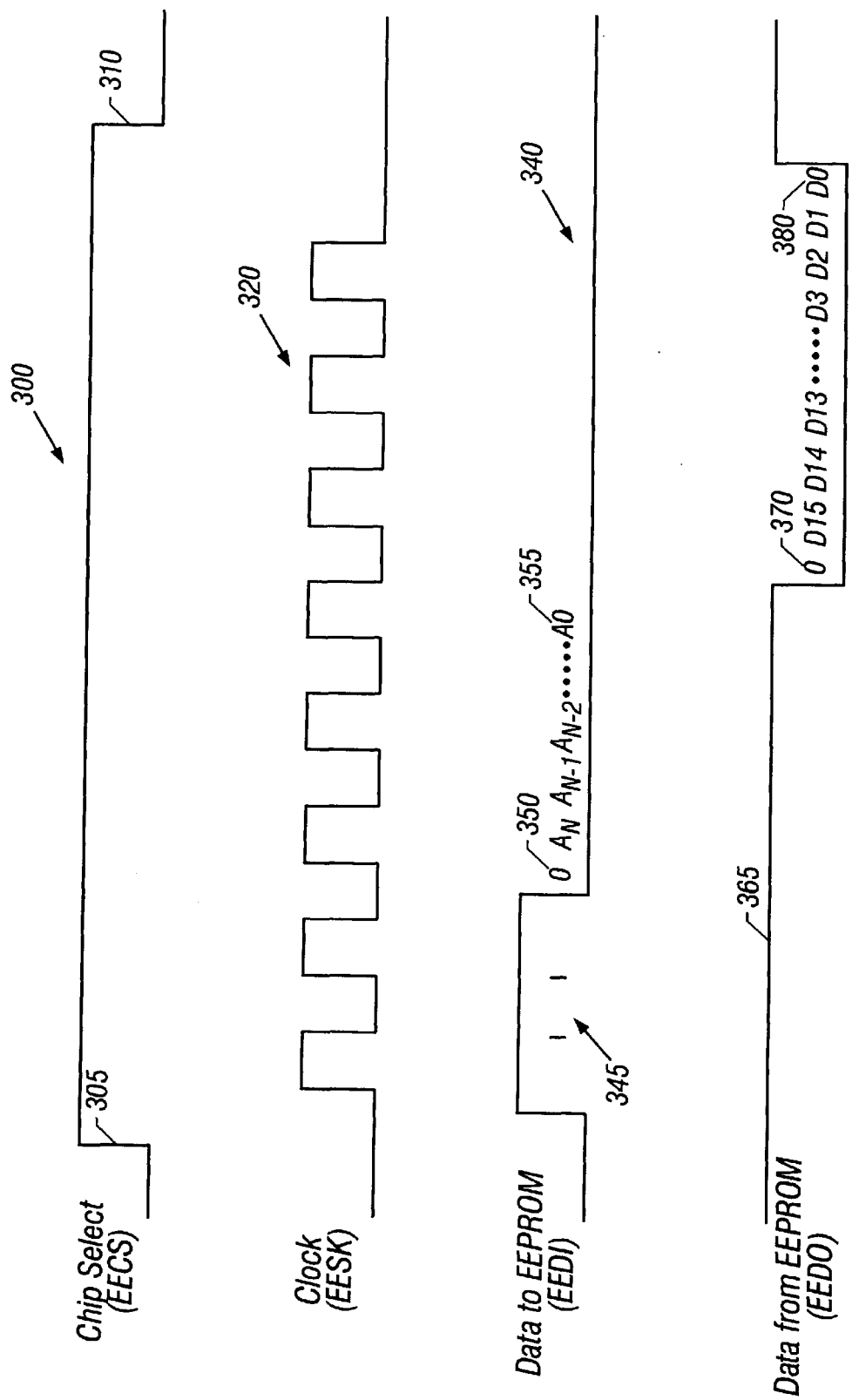
FIG. 3 illustrates timing diagrams of the connections between the controller and the EEPROM of FIG. 1.

FIG. 3 illustrates timing diagrams of the connections between the controller 100 and the EEPROM 150. The timing diagrams include the chip select signal (EECS) 300, the clock signal (EESK) 320, the data-in to the EEPROM signal (EEDI) 340, and the data-out from the EEPROM signal (EEDO) 360.

The chip select signal 300 goes high at a point 305, thereby indicating that the EEPROM 150 should monitor the data-in line 115 and the clock signal 110. The chip select signal 300 remains high during the entire communication with the EEPROM 150 address and data. After the EEPROM 150 has been addressed, and the data has been received from the EEPROM 150, the chip select signal goes low at a point 310. When the chip select signal 300 goes high again, the EEPROM 150 knows to expect data representing another address location.

The data-in to the EEPROM signal 340 is initially at a logical low. After the start bit is sent by the chip select signal 300, the controller 100 provides the EEPROM a 2-bit OpCode at a point 345 over the data-in signal 340. After the 2-bit OpCode is sent, the controller 100 begins to provide logical low address bits ($A_N$) at a point 350. The controller 100 continues to provide logical low address bits ($A_{N-1}$, $A_{N-2}$...) according to the process 200 until the final address bit ($A_0$) is transmitted at a point 355.

The data-out signal 360 is biased high at a point 365 throughout the process 200 until the EEPROM 150 is properly addressed and drives the data-out signal 360 low. After the final address bit is received at a point 355 along the data-in signal 340, the EEPROM 150 drives the data-out signal 360 low at a point 370. The EEPROM 150 then transmits 16 bits of data (D15 through D0) from the appropriate address location from point 375 to point 380.

Numerous variations and modifications of the invention will become readily apparent to those skilled in the art.

Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of determining a size of an EEPROM comprising:

a) providing an address bit to the EEPROM;

b) incrementing a value of a counter c) repeating steps (a) and (b) until the EEPROM responds; and d) determining the size of the EEPROM from the value of the counter.

2. The method of claim 1, wherein the address bit is a logical low.

3. The method of claim 1, wherein the EEPROM responds by driving a data out pin low.

4. The method of claim 3, wherein the data out pin is biased high.

5. The method of claim 1, wherein the EEPROM size is in a range from about 256 bits to 64 Kbits.

6. The method of claim 1, wherein the size of the EEPROM is determined from a look-up table.

7. The method of claim 1, further comprising the step of determining that no EEPROM is present or the EEPROM is malfunctioning if the number of address bits provided exceeds a predetermined value.

8. The method of claim 1, further comprising:

comparing the value of the counter to a predetermined value; and determining the EEPROM is not present if the value of the counter exceeds the predetermined value.

9. A circuit for automatically determining the size of an EEPROM comprising:

a controller;

a data-in line adapted to be connected to the EEPROM, wherein the controller transmits an address bit over the data-in line;

a counter which is incremented after each address bit is transmitted; and a data-out line adapted to be connected to the EEPROM, wherein the controller monitors the data-out line to determine when the EEPROM has been addressed, the controller determining the size of the EEPROM from the counter after the EEPROM has been addressed.

10. The circuit of claim 9, wherein the address bit transmitted over the data-in line is a logical low.

11. The circuit of claim 9, wherein the EEPROM drives the data-out line low after being addressed.

12. The circuit of claim 9, wherein the data-out line is biased high.

13. The circuit of claim 9, wherein the EEPROM size is in a range from about 256 bits to 64 Kbits.

14. The circuit of claim 9, wherein the size of the EEPROM is determined from a look-up table.

15. The circuit of claim 9, wherein the controller compares the value of the counter to a predetermined maximum value and determines the EEPROM is not present if the value of the counter exceeds the predetermined maximum value.

16. A method of determining a size of an EEPROM comprising:

providing a series of address bits to the EEPROM;

detecting a response from the EEPROM; and determining the size of the EEPROM from a number of address bits provided to the EEPROM.

17. The method of claim 16, wherein the address bit is a logical low.

18. The method of claim 16, wherein the EEPROM responds by driving a data out pin low.

19. The method of claim 16, further comprising the step of incrementing a counter for each address bit provided.

20. The method of claim 16, further comprising the step of determining that no EEPROM is present or the EEPROM is malfunctioning if the number of address bits provided exceeds a predetermined value.

* * * * *